United States Patent
Yamashita et al.

(10) Patent No.: US 10,262,914 B2
(45) Date of Patent: Apr. 16, 2019

(54) RESIN COMPOSITION FOR ENCAPSULATION, AND SEMICONDUCTOR DEVICE

(71) Applicant: SUMITOMO BAKELITE CO., LTD., Tokyo (JP)

(72) Inventors: Katsushi Yamashita, Tokyo (JP); Yui Takahashi, Tokyo (JP)

(73) Assignee: Sumitomo Bakelite Co., Ltd., Tokyo (JP)

(*) Notice: Subject to any disclaimer, the term of this patent is extended or adjusted under 35 U.S.C. 154(b) by 0 days.

(21) Appl. No.: 15/775,275

(22) PCT Filed: Nov. 28, 2016

(86) PCT No.: PCT/JP2016/085165
§ 371 (c)(1),
(2) Date: May 10, 2018

(87) PCT Pub. No.: WO2017/110373
PCT Pub. Date: Jun. 29, 2017

(65) Prior Publication Data
US 2018/0337105 A1    Nov. 22, 2018

(30) Foreign Application Priority Data

Dec. 25, 2015   (JP) ................... 2015-254082

(51) Int. Cl.
*H01L 23/29*   (2006.01)
*C08K 3/36*   (2006.01)
(Continued)

(52) U.S. Cl.
CPC ............. *H01L 23/295* (2013.01); *C08K 3/08* (2013.01); *C08K 3/36* (2013.01); *C08L 79/00* (2013.01);
(Continued)

(58) Field of Classification Search
CPC ......... H01L 23/295; H01L 2224/48245; H01L 2924/186; H01L 2924/10254;
(Continued)

(56) References Cited

U.S. PATENT DOCUMENTS 6,399,677 B2 *  6/2002  Tomiyoshi ............... C08K 3/36
                                                  257/E23.121
9,431,314 B2    8/2016  Enomoto et al.
(Continued)

FOREIGN PATENT DOCUMENTS

CN       102453340 A    5/2012
CN       104937036 A    9/2015
(Continued)

OTHER PUBLICATIONS

Office Action dated Aug. 21, 2018, in Korean Patent Application No. 10-2018-7017378.
(Continued)

*Primary Examiner* — Kyoung Lee
(74) *Attorney, Agent, or Firm* — Birch, Stewart, Kolasch & Birch, LLP

(57) ABSTRACT

Provided is a resin composition for encapsulation used for encapsulating a power semiconductor element formed from SiC, GaN, $Ga_2O_3$, or diamond, the resin composition for encapsulation including a thermosetting resin (A) and silica (B), in which the silica (B) includes Fe, the content of Fe is equal to or less than 220 ppm with respect to the total amount of the silica (B), and the resin composition is in a granular form, a tablet form, or a sheet form.

12 Claims, 2 Drawing Sheets

(51) Int. Cl.
*C08L 79/00* (2006.01)
*C08L 101/00* (2006.01)
*H01L 23/31* (2006.01)
*C08K 3/08* (2006.01)
*C08L 79/08* (2006.01)
*H01L 23/00* (2006.01)

(52) U.S. Cl.
CPC ........... *C08L 79/085* (2013.01); *C08L 101/00* (2013.01); *H01L 23/29* (2013.01); *H01L 23/31* (2013.01); *C08K 2003/0856* (2013.01); *C08K 2003/0862* (2013.01); *C08K 2003/0881* (2013.01); *C08K 2201/005* (2013.01); *C08L 2203/206* (2013.01); *C08L 2205/025* (2013.01); *H01L 24/48* (2013.01); *H01L 2224/48091* (2013.01); *H01L 2224/48227* (2013.01); *H01L 2224/48245* (2013.01); *H01L 2224/48247* (2013.01); *H01L 2924/1033* (2013.01); *H01L 2924/1067* (2013.01); *H01L 2924/10254* (2013.01); *H01L 2924/10272* (2013.01); *H01L 2924/15311* (2013.01); *H01L 2924/181* (2013.01); *H01L 2924/186* (2013.01)

(58) Field of Classification Search
CPC ... H01L 2924/1033; H01L 2924/10272; H01L 2924/1067; H01L 24/48; C08L 79/085; C08L 2205/025; C08L 2203/206; C08K 2003/0862; C08K 2003/0881; C08K 3/08; C08K 3/36; C08K 2003/0856; C08K 2201/005
See application file for complete search history.

(56) References Cited

U.S. PATENT DOCUMENTS

| | | | |
|---|---|---|---|
| 9,443,779 | B2 | 9/2016 | Takematsu et al. |
| 2001/0004651 | A1 | 6/2001 | Tomiyoshi et al. |
| 2012/0101191 | A1 | 4/2012 | Enomoto et al. |
| 2012/0153345 | A1* | 6/2012 | Ozaki .................. H01L 33/507 257/100 |
| 2015/0380335 | A1 | 12/2015 | Takematsu et al. |
| 2016/0215168 | A1 | 7/2016 | Oda et al. |

FOREIGN PATENT DOCUMENTS

| | | | |
|---|---|---|---|
| CN | 105190872 | A | 12/2015 |
| JP | 04-175358 | A | 6/1992 |
| JP | 7-242411 | A | 9/1995 |
| JP | 11-322816 | A | 11/1999 |
| JP | 2008-137854 | A | 6/2008 |
| JP | 2015-054898 | A | 3/2015 |
| JP | 2015-101668 | A | 6/2015 |
| JP | 2015-189935 | A | 11/2015 |
| SG | 11201505714 | W | 1/2014 |
| WO | WO 2016/120953 | A1 | 8/2016 |

OTHER PUBLICATIONS

International Search Report for PCT/JP2016/085165 (PCT/ISA/210) dated Dec. 20, 2016.
Written Opinion of the International Searching Authority for PCT/JP2016/085165 (PCT/ISA/237) dated Dec. 20, 2016.
Office Action dated Jan. 23, 2019, in the corresponding Chinese Application No. 201680076081.0, with an English Translation.

* cited by examiner

RESIN COMPOSITION FOR ENCAPSULATION, AND SEMICONDUCTOR DEVICE

TECHNICAL FIELD

The present invention relates to a resin composition for encapsulation, and a semiconductor device.

BACKGROUND ART

With regard to the resin compositions that are used for semiconductor devices, various investigations have been conducted in view of suppressing the warpage of chips. Regarding such technologies, for example, the technology described in Patent Document 1 may be mentioned. Patent Document 1 describes a resin paste composition including an epoxy resin and a maleimide resin. According to the same document, it is described that when such a resin paste composition is used as a die bonding material for a semiconductor device, warpage in a silicon chip that has been formed on a copper lead frame by disposing a die bonding material therebetween can be suppressed.

RELATED DOCUMENT

Patent Document

[Patent Document 1] Japanese Laid-Open Patent Publication No.

SUMMARY OF THE INVENTION

Technical Problem

The resin paste described in the above-mentioned patent document is a die attach material that adheres a silicon chip to a lead frame, and this is a product different from a general encapsulant material that encapsulates semiconductor elements.

The inventors of the present invention conducted an investigation, and as a result, it was found that in a case in which the resin paste described in the document is applied to an encapsulant material that encapsulates power semiconductor elements such as described below, there is room for improvement from the viewpoint of durability for long-term use in an environment at high temperature.

Here, since power semiconductor elements that use wide band gap materials such as SiC, GaN, $Ga_2O_3$, or diamond are designed to be used under the conditions of high voltage and large current, the amount of heat generation is larger compared to conventional silicon chips. Therefore, the power semiconductor elements may be operated in an environment of higher temperature.

Solution to Problem

The inventors of the present invention took note of durability for long-term use in a high-temperature environment and the impurities of silica with regard to a resin composition for encapsulation that is used for encapsulating power semiconductor elements, and conducted a thorough investigation. As a result, the inventors found that such durability can be enhanced by controlling the type and content of the impurities of silica as appropriate, and thus the inventors completed the present invention.

According to the present invention, there is provided a resin composition for encapsulation used for encapsulating a power semiconductor element formed from SiC, GaN, $Ga_2O_3$, or diamond, the resin composition for encapsulation including:
a thermosetting resin (A); and
silica (B),
in which the silica (B) includes Fe, the content of Fe is equal to or less than 220 ppm with respect to the total amount of the silica (B), and the resin composition is in a granular form, a tablet form, or a sheet form.

According to the present invention, there is provided a semiconductor device including:
a power semiconductor element mounted over a substrate and formed from SiC, GaN, $Ga_2O_3$, or diamond; and
an encapsulant material composed of a cured product obtainable by curing the resin composition for encapsulation described above and intended for encapsulating the power semiconductor element.

Advantageous Effects of Invention

According to the present invention, a resin composition for encapsulation that can enhance the durability of an encapsulant material for long-term use in a high-temperature environment, and a semiconductor device that uses the resin composition can be provided.

BRIEF DESCRIPTION OF THE DRAWINGS

The objects described above, and other objects, features, and advantages will be further made clear by the suitable embodiments described below and the following drawings pertaining thereto.

DESCRIPTION OF EMBODIMENTS

Figure 1:
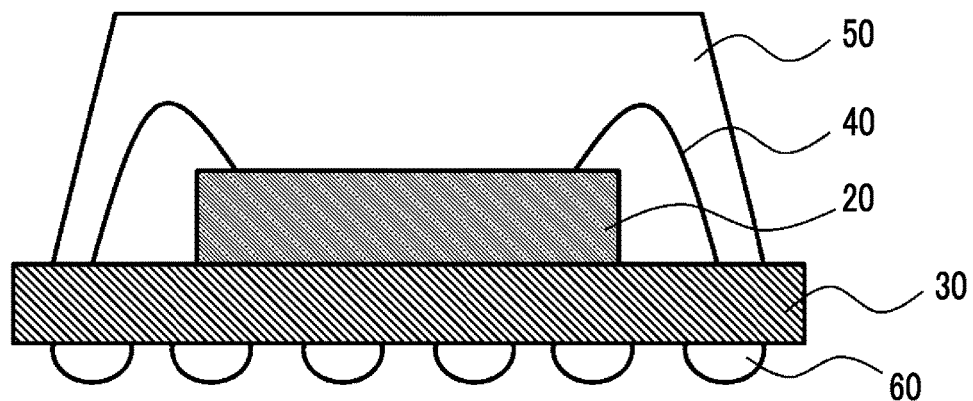
FIG. 1 is a cross-sectional view illustrating an example of a semiconductor device according to the present embodiment.

Hereinafter, embodiments will be described using the drawings. In all of the drawings, the same reference numeral will be assigned to the same constituent element, and further explanation will not be repeated.

An outline of the resin composition for encapsulation of the present embodiment will be described.

The resin composition for encapsulation according to the present embodiment is a resin composition for encapsulation that is used in order to encapsulate power semiconductor elements formed from SiC, GaN, $Ga_2O_3$, or diamond, and includes a thermosetting resin (A) and silica (B). Silica (B) includes Fe, and the content of such Fe is equal to or less than 220 ppm with respect to the total amount of silica (B).

The resin composition for encapsulation of the present embodiment can be produced into a granular form, a tablet form, or a sheet form.

In regard to conventional silicon devices, it is important that the silicon devices can be used in an environment at a temperature of, for example, about 175° C. Under such circumstances, investigations on the storage characteristics of encapsulant materials in an environment at about 175° C. have been conducted heretofore.

However, the long-term storage characteristics of encapsulant materials in a high-temperature environment at above 200° C. have not been sufficiently conducted. Here, an encapsulant material that encapsulates a power semiconductor element which uses a wide band gap material such as SiC, GaN, $Ga_2O_3$, or diamond, is required to have characteristics enabling long-term use in a high-temperature environment at above 200° C. Such high-temperature long-term storage characteristics can be evaluated based on the mass reduction ratio obtainable in a case in which an encapsulant material in a high-temperature environment at a temperature of, for example, 250° C.

The inventors of the present invention took note of the durability for long-term use in a high-temperature environment and the impurities of silica with regard to a resin composition for encapsulation that is used for encapsulating a power semiconductor element, and thus conducted a thorough investigation. As a result, the inventors found that such durability can be enhanced by controlling the type and content of the impurities of silica.

The inventors further conducted an investigation based on these findings, and as a result, the inventors newly found that when the content of Fe or other impurities such as Mn in silica (B) that is included in a resin composition for encapsulation is controlled to be equal to or less than a predetermined value, the storage characteristics in a high-temperature environment at above 200° C. of the encapsulant material formed using the resin composition for encapsulation can be enhanced. Therefore, according to the present embodiment, the durability of the encapsulant material for long-term use in a high-temperature environment can be enhanced. Thereby, the resin composition for encapsulation can also contribute to an increase in the reliability of semiconductor devices.

In the following description, the resin composition for encapsulation according to the present embodiment, and a semiconductor device produced using the resin composition for encapsulation will be explained in detail.

The resin composition for encapsulation of the present embodiment is used to encapsulate a power semiconductor element formed using SiC (silicon carbide), GaN (gallium nitride), $Ga_2O_3$ (gallium oxide), or diamond as a semiconductor material. The power semiconductor element is, for example, a semiconductor element that performs control and supply of the power supply or the electric power. According to the present embodiment, for example, a semiconductor element having an input power of 1.7 W or higher can be used as the above-mentioned power semiconductor element.

According to the present embodiment, an encapsulant material that encapsulates a power semiconductor element mounted on a substrate, is constructed from, for example, a cured product obtainable by curing a resin composition for encapsulation. Thereby, a semiconductor device including a substrate, a power semiconductor element mounted on the substrate, and an encapsulant material encapsulating the power semiconductor element is formed. In this case, the encapsulant material can encapsulate a power semiconductor element so as to cover, for example, at least the top surface of the power semiconductor element. The top surface of a power semiconductor element is a surface of the power semiconductor element, the surface being on the opposite side of the surface that faces the substrate.

The resin composition for encapsulation may have a predetermined shape such as, for example, a granular shape, a tablet shape, or a sheet shape. Thereby, it becomes easy to perform encapsulation molding of a semiconductor element using a known molding method such as transfer molding, injection molding, or compression molding. According to the present embodiment, the granular form means an aggregate obtained by consolidating a powder of a resin composition for encapsulation, the tablet form means a formed object that has been formed to have a predetermined shape by tableting a resin composition for encapsulation at a high pressure. A sheet form means a resin film formed from a resin composition for encapsulation, the resin film being in the form of individual sheets or a windable roll. The resin composition for encapsulation in a granular form, a tablet form or a sheet form may also be in a semi-cured state (B-stage state).

In the following description, the various components of the resin composition for encapsulation of the present embodiment will be explained.

The resin composition for encapsulation of the present embodiment includes a thermosetting resin (A) and silica (B), as described above.

(Thermosetting Resin (A))

The thermosetting resin (A) can include one kind or two or more kinds selected from, for example, a compound having two or more maleimide groups, a compound having two or more benzoxazine rings, an epoxy resin, a phenolic resin, a urea resin, a resin having a triazine ring, such as a melamine resin, an unsaturated polyester resin, a polyurethane resin, a diallyl phthalate resin, a silicone resin, cyanate resin, a polyimide resin, a polyamideimide resin, and a benzocyclobutene resin.

From the viewpoint of enhancing the long-term storage characteristics of the encapsulant material in a high-temperature environment at a temperature of 200° C. or higher, or the mechanical characteristics of the encapsulant material, it is preferable that the resin composition for encapsulation includes, as the thermosetting resin (A), one kind or two or more kinds selected from, for example, a compound having two or more maleimide groups, a compound having two or more benzoxazine rings, and an epoxy resin, and it is more preferable that the resin composition includes at least a compound having two or more maleimide groups. Since the glass transition temperature (Tg) of the cured product of the resin composition for encapsulation can be raised thereby, consequently, it is possible to increase the heat resistance of a semiconductor device that uses this cured product.

Particularly, from the viewpoint of achieving a balance between toughness and mechanical strength, it is a preferred exemplary embodiment to use a compound having two or more maleimide groups and a compound having two or more benzoxazine rings in combination. Furthermore, from the viewpoint of improving the balance between toughness and mechanical strength, it is another preferred exemplary embodiment to use a compound having two or more maleimide groups and an epoxy resin in combination. Meanwhile, according to the present embodiment, for example, it is also possible to adopt an embodiment in which the thermosetting resin (A) includes an epoxy resin, but does not include a compound having two or more maleimide groups. When it is said that the thermosetting resin (A) does not include a compound having two or more maleimide groups, it is implied that, for example, the content of a compound having two or more maleimide groups is less than 1% by mass with respect to the total amount of the resin composition for encapsulation.

The compound having two or more maleimide groups can include, for example, at least one of a compound represented by the following Formula (1) and a compound represented by the following Formula (2). Thereby, the Tg of the cured product of the resin composition for encapsulation can be increased, and the high-temperature long-term storage characteristics of the encapsulant material can be enhanced more effectively.

(1)

In Formula (1) described above, $R_1$ represents a divalent organic group having 1 to 30 carbon atoms, which may contain one or more of an oxygen atom and a nitrogen atom. From the viewpoint of enhancing the high-temperature storage characteristics of the encapsulant material, it is more preferable that $R_1$ is an organic group containing an aromatic ring. According to the present embodiment, examples of $R_1$ include a structure represented by the following Formula (1a):

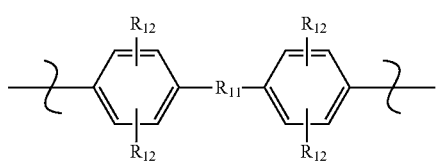
(1a)

In regard to Formula (1a) described above, $R_{11}$ represents a divalent organic group having 1 to 18 carbon atoms, which may also contain one or more of an oxygen atom and a nitrogen atom. A plurality of $R_{12}$'s each independently represent a hydrogen atom, or a substituted or unsubstituted hydrocarbon group having 1 to 4 carbon atoms.

Examples of the compound represented by Formula (1) that can be applied to the present embodiment include compounds represented by the following Formulae (1-1) to (1-3):

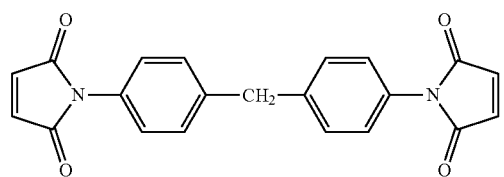
(1-1)

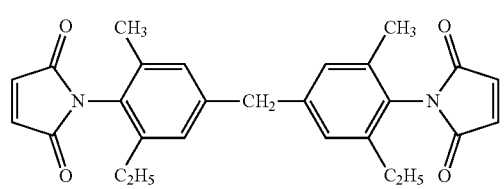
(1-2)

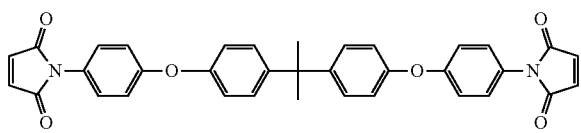
(1-3)

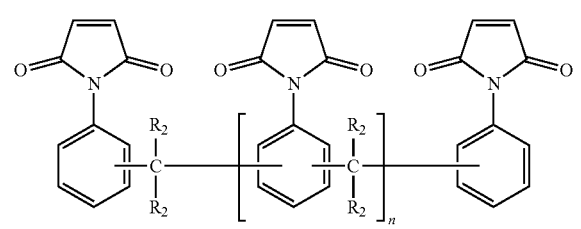
(2)

In regard to Formula (2), a plurality of $R_2$'s each independently represent a hydrogen atom, or a substituted or unsubstituted hydrocarbon group having 1 to 4 carbon atoms.

The compound having two or more benzoxazine rings can include, for example, at least one of a compound represented by the following Formula (3) and a compound represented by the following Formula (4), and it is more preferable that the compound having two or more benzoxazine rings includes at least a compound represented by the following Formula (3). Thereby, the high-temperature long-term storage characteristics of the encapsulant material can be enhanced more effectively. Furthermore, the compound can also contribute to an enhancement of the mechanical characteristics of the encapsulant material.

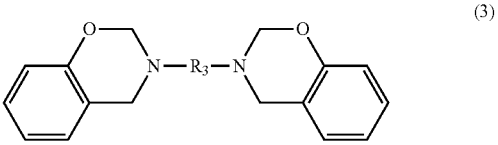
(3)

In regard to Formula (3) described above, $R_3$ represents a divalent organic group having 1 to 30 carbon atoms, which may contain one or more of an oxygen atom and a nitrogen atom. From the viewpoint of enhancing the high-temperature storage characteristics of the encapsulant material, it is more preferable that $R_3$ is an organic group containing an aromatic ring. According to the present embodiment, for example, a compound represented by the following Formula (3a) can be used as the compound represented by Formula (3).

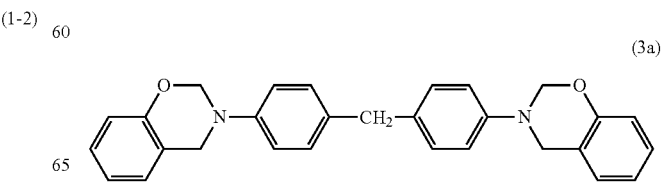
(3a)

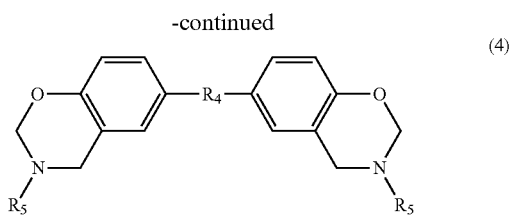

(4)

In regard to Formula (4), $R_4$ represents a divalent organic group having 1 to 30 carbon atoms, which may contain one or more of an oxygen atom, a nitrogen atom, and a sulfur atom. Two $R_5$'s are each independently an aromatic hydrocarbon group having 1 to 12 carbon atoms.

The epoxy resin can include, for example, one kind or two or more kinds selected from a biphenyl type epoxy resin; a bisphenol type epoxy resin such as a bisphenol A type epoxy resin, a bisphenol F type epoxy resin, or a tetramethyl bisphenol F type epoxy resin; a stilbene type epoxy resin; a novolac type epoxy resin such as a phenol-novolac type epoxy resin or a cresol-novolac type epoxy resin; a polyfunctional epoxy resin such as a triphenylmethane type epoxy resin or an alkyl-modified triphenolmethane type epoxy resin; an aralkyl type epoxy resin such as a phenol aralkyl type epoxy resin having a phenylene skeleton, or a phenol aralkyl type epoxy resin having a biphenylene skeleton; a naphthol type epoxy resin such as a dihydroxynaphthalene type epoxy resin, or an epoxy resin obtainable by subjecting a dihydroxynaphthalene dimer to glycidyl etherification; a triazine nucleus-containing epoxy resin such as triglycidyl isocyanurate or monoallyl diglycidyl isocyanurate; and a bridged cyclic hydrocarbon compound-modified phenol type epoxy resin such as a dicyclopentadiene-modified phenol type epoxy resin.

The content of the thermosetting resin (A) in the resin composition for encapsulation is, for example, preferably equal to or more than 7% by mass, more preferably equal to or more than 12% by mass, and particularly preferably equal to or more than 16% by mass, with respect to the total amount of the resin composition for encapsulation. When the content of the thermosetting resin (A) is adjusted to be equal to or greater than the lower limit mentioned above, fluidity of the resin composition for encapsulation can be increased, and formation of a more stable encapsulant material is enabled. Furthermore, the content of the thermosetting resin (A) in the resin composition for encapsulation is, for example, preferably equal to or less than 40% by mass, more preferably equal to or less than 35% by mass, and particularly preferably equal to or less than 30% by mass, with respect to the total amount of the resin composition for encapsulation. When the content of the thermosetting resin (A) is adjusted to be equal to or less than the upper limit mentioned above, moisture-resistant reliability or reflow resistance of semiconductor devices can be improved.

(Silica (B))

Silica (B) can include one kind or two or more kinds selected from, for example, spherical fused silica, crushed fused silica, and crystalline silica. Among these, from the viewpoint of enhancing the packing properties of the resin composition for encapsulation, the high-temperature long-term storage characteristics of the encapsulant material, and the like, it is more preferable that the resin composition for encapsulation includes spherical fused silica. Furthermore, it is also acceptable that the silica (B) is amorphous.

Silica (B) may include Fe (iron) as an impurity.

Silica (B) may also include, in addition to Fe, one or more components selected from the group consisting of Mn (manganese), Ni (nickel), Ti (titanium), Ca (calcium), and P (phosphorus), as impurities.

The inventors of the present invention conducted an investigation, and as a result, they found that when a resin layer formed from a resin composition for encapsulation including such silica (B) is used as an encapsulant material for a power semiconductor element, deterioration of the resin layer occurs, such as that peeling or cracking occurs at the interface between the resin and a filler such as silica, or deterioration of the resin itself occurs as a result of oxidative decomposition.

The detailed mechanism is not clearly understood; however, it is speculated that when Fe or other impurities such as Mn, Ni and Ti work as catalysts in the use environment for a power semiconductor element (for example, high temperature conditions such as 200° C. or higher or 250° C. or higher), peeling and cracking, or deterioration of the resin layer such as oxidative decomposition of the resin itself occurs as described above.

Based on these findings, the inventors of the present invention conducted a thorough investigation, and as a result, the inventors found that durability for long-term use in a high-temperature environment can be enhanced by controlling the type and content of impurities as appropriate, thus completing the present invention.

Furthermore, when the resin composition for encapsulation of the present embodiment is used, deterioration caused by oxidative decomposition of the resin itself such as described above can be suppressed.

Here, in regard to the resin composition for encapsulation according to the present embodiment, the content of Fe with respect to the total amount of silica (B) is, for example, equal to or less than 220 ppm; however, the content is preferably equal to or less than 200 ppm, and more preferably equal to or less than 180 ppm. By adjusting the content as such, the long-term storage characteristics under high temperature conditions or the mechanical characteristics of the encapsulant material can be enhanced more effectively.

According to the present inventors, it is assumed that under high temperature conditions at 200° C. or higher, the action of iron to promote oxidative decomposition of the resin serves as one of the factors for deterioration.

The present inventors consider that in a case in which the content of Fe with respect to the total amount of silica (B) is controlled to be within the value range described above, the level of the oxidation of the resin occurring within the encapsulant material can be consequently reduced, and therefore, deterioration attributed to oxidation within the encapsulant material can be suppressed. Meanwhile, the lower limit of the content of Fe in the silica (B) is not particularly limited, and the lower limit may be equal to or more than 0 ppm, or may be equal to or more than 1 ppm.

According to the present embodiment, the content of Fe in the silica (B) can be measured by, for example, ICP emission spectroscopy.

Furthermore, silica (B) may also include Mn (manganese) as an impurity.

Here, it is preferable that the content of Mn (manganese) with respect to the total amount of silica (B) is as small as possible. Thereby, the long-term storage characteristics of the encapsulant material formed using the resin composition for encapsulation under high temperature conditions at 200° C. or higher can be enhanced.

The reason why the high-temperature long-term storage characteristics of an encapsulant material can be enhanced when the encapsulant materials includes a silica (B) having the content of Mn reduced to a level as low as possible, is not clearly understood; however, it is assumed, as one of the factors, that deterioration caused by oxidation of the interior of the encapsulant material under high temperature conditions at 200° C. or higher can be suppressed. Specifically, the present inventors speculate that in a case in which silica (B) having a content of Mn that is as small as possible is used, in the interior of an encapsulant material under high temperature conditions at 200° C. or higher, oxidation of a resin component existing in the interior of the encapsulant material by Mn, which is one of oxidizing agents, is suppressed. Furthermore, in regard to such suppression of deterioration, it is possible to evaluate the suppression based on, for example, the mass reduction ratio obtainable in the case of storing an encapsulant material for 1,000 hours in a high-temperature environment at 250° C. The lower limit of the content of Mn in the silica (B) is not particularly limited, and the lower limit may be equal to or more than 0 ppm, or may be equal to or more than 1 ppm.

According to the present embodiment, the upper limit of the sum value of the contents of Fe and Mn is, for example, equal to or less than 220 ppm, preferably equal to or less than 215 ppm, and more preferably equal to or less than 210 ppm, with respect to the total amount of silica (B). Thereby, the high-temperature long-term storage characteristics of the encapsulant material can be enhanced. Meanwhile, the lower limit of the sum value of the contents of Fe and Mn is not particularly limited; however, the lower limit may be, for example, equal to or more than 0 ppm, or may be equal to or more than 1 ppm.

According to the present embodiment, the content of Mn in the silica (B) can be measured by, for example, ICP emission spectroscopy.

According to the present embodiment, two or more kinds of silica having different contents of various impurities may be included in the silica (B). Thereby, reduction of the production cost can be promoted while the heat resistance or mechanical characteristics of the encapsulant material are enhanced.

Silica (B) may also include Ni (nickel) as an impurity.

Here, it is preferable that the content of Ni (nickel) with respect to the total amount of the silica (B) is as small as possible.

Thereby, the long-term storage characteristics at high temperature or the mechanical characteristics of the encapsulant material can be enhanced more effectively. The reason for this is not clearly understood; however, the present inventors speculate that in the case of using a silica (B) having the content of Ni (nickel) reduced to a level as low as possible, the amount of the resin component being oxidized in the interior of the encapsulant material under high temperature conditions at 200° C. or higher can be reduced, and therefore, deterioration caused by oxidation in the interior of the encapsulant material can be suppressed. Meanwhile, the lower limit of the content of Ni in the silica (B) is not particularly limited, and the lower limit may be equal to or more than 0 ppm, or may be equal to or more than 1 ppm.

Silica (B) may also include Ti (titanium) as an impurity.

Here, it is preferable that the content of Ti (titanium) with respect to the total amount of the silica (B) is as small as possible. Thereby, the long-term storage characteristics at high temperature or the mechanical characteristics of the encapsulant material can be enhanced more effectively. The reason for this is not clearly understood; however, the present inventors speculate that in the case of using a silica (B) having the content of Ti (nickel) reduced to a level as low as possible, the amount of the resin component being oxidized in the interior of the encapsulant material under high temperature conditions at 200° C. or higher can be reduced, and therefore, deterioration caused by oxidation in the interior of the encapsulant material can be suppressed. Meanwhile, the lower limit of the content of Ti in the silica (B) is not particularly limited, and the lower limit may be equal to or more than 0 ppm, or may be equal to or more than 1 ppm.

According to the present embodiment, in a case in which silica (B) includes Fe, Mn, Ni, and Ti, the upper limit of the sum value of the contents of Fe, Ni and Ti is, for example, equal to or less than 260 ppm, preferably equal to or less than 250 ppm, and more preferably equal to or less than 240 ppm, with respect to the total amount of the silica (B). Thereby, the high-temperature long-term storage characteristics of the encapsulant material can be enhanced. Meanwhile, the lower limit of the sum value of the contents of Fe, Mn, Ni, and Ti is not particularly limited; however, the lower limit may be, for example, equal to or more than 0 ppm, or may be equal to or more than 1 ppm.

Furthermore, according to the present embodiment, in a case in which silica (B) includes Fe, Mn, Ni, and Ti, the upper limit of the proportion of the content of Fe with respect to the sum value of the contents of Fe, Ni and Ti is, for example, equal to or less than 86.0%, preferably equal to or less than 85.9%, and more preferably equal to or less than 85.8%. Thereby, the high-temperature long-term storage characteristics of the encapsulant material can be enhanced. Meanwhile, the lower limit of the sum value of the contents of Fe, Mn, Ni, and Ti is not particularly limited; however, the lower limit may be, for example, equal to or more than 50.0%, or may be equal to or more than 60.0%. Thereby, a resin composition for encapsulation having excellent high-temperature long-term storage characteristics can be produced stably.

According to the present embodiment, the contents of Ni and Ti in the silica (B) can be measured by, for example, ICP emission spectroscopy.

According to the present embodiment, silica (B) may also include Ca as an impurity. In a case in which silica (B) includes Ca, the upper limit of the content of Ca may be equal to or less than 50 ppm, or may be equal to or less than 45 ppm, with respect to the total amount of the silica (B). Thereby, the insulation reliability of the power semiconductor element can be increased. Meanwhile, the lower limit of the content of Ca is not particularly limited; however, the lower limit may be, for example, equal to or more than 0 ppm, or may be equal to or more than 1 ppm.

According to the present embodiment, silica (B) may also include P as an impurity. In a case in which silica (B) includes P, the upper limit of the content of P may be equal to or less than 9 ppm, or may be equal to or less than 8 ppm, with respect to the total amount of silica (B). Thereby, the insulation reliability of the power semiconductor element can be increased. Meanwhile, the lower limit of the content of P is not particularly limited; however, the lower limit may be, for example, equal to or more than 0 ppm, or may be equal to or more than 1 ppm.

Silica (B) is such that, for example, the content of $SiO_2$ is equal to or more than 99.8% by mass. When such a silica having high purity is used, an encapsulant material having satisfactory heat resistance and mechanical characteristics can be easily realized, while the quantity of ionic impurities such as the metal impurities described above is reduced. From the viewpoint of more effectively enhancing the high-temperature long-term storage characteristics of the encapsulant material, it is preferable that the content of $SiO_2$ in silica (B) is equal to or more than 99.9% by mass.

The content of silica (B) in the resin composition for encapsulation is, for example, preferably equal to or more than 55% by mass, more preferably equal to or more than 60% by mass, and particularly preferably equal to or more than 65% by mass, with respect to the total amount of the resin composition for encapsulation. Thereby, the long-term storage characteristics under high temperature conditions at 200° C. or higher of the encapsulant material formed using the resin composition for encapsulation can be more effectively enhanced. The silica (B) can also contribute to an enhancement of the mechanical characteristics of the encapsulant material. Meanwhile, the content of silica (B) in the resin composition for encapsulation is, for example, preferably equal to or less than 90% by mass, more preferably equal to or less than 87% by mass, and particularly preferably equal to or less than 85% by mass, with respect to the total amount of the resin composition for encapsulation. Thereby, deterioration of moldability resulting from a decrease in fluidity of the resin composition for encapsulation, a bonding wire sweeping caused by viscosity increase, and the like can be suppressed.

The average particle size d50 of silica (B) may be, for example, equal to or larger than 0.1 µm or may be equal to or larger than 0.5 µm, and the average particle size d50 may be equal to or smaller than 50 µm or may be equal to or smaller than 40 µm. Furthermore, two or more kinds of silica (B) having different average particle sizes can be used in combination.

(Curing Agent (C))

The resin composition for encapsulation can include a curing agent (C) as necessary, together with the thermosetting resin (A).

(Curing Accelerator (D))

The resin composition for encapsulation can include, for example, a curing accelerator (D). The curing accelerator (D) may be any compound that accelerates a crosslinking reaction of the thermosetting resin (A). The resin composition for encapsulation can include, for example, one kind or two or more kinds selected from phosphorus atom-containing compounds such as an organic phosphine, a tetra-substituted phosphonium compound, a phosphobetaine compound, an addition product between a phosphine compound and a quinone compound, and an addition product between a phosphonium compound and a silane compound; imidazoles such as 2-methylimidazole; and nitrogen atom-containing compounds, including amidines or tertiary amines such as 1,8-diazabicyclo[5.4.0]undecene-7 and benzyldimethylamine, and quaternary salts of the amidines or amines described above.

The content of the curing accelerator (D) in the resin composition for encapsulation is, for example, preferably equal to or more than 0.01% by mass, and more preferably equal to or more than 0.03% by mass, with respect to the total amount of the resin composition for encapsulation. When the content of the curing accelerator (D) is adjusted to be equal to or more than the lower limit, curability of the resin composition can be effectively enhanced. Meanwhile, the content of the curing accelerator (D) in the resin composition for encapsulation is, for example, preferably equal to or less than 5% by mass, and more preferably equal to or less than 3% by mass, with respect to the total amount of the resin composition for encapsulation. When the content of the curing accelerator (D) is adjusted to be equal to or less than the upper limit, the handling performance of the resin composition for encapsulation can be enhanced.

(Coupling Agent (E))

The resin composition for encapsulation can include, for example, a coupling agent (E). The coupling agent (E) can be incorporated into the resin composition for encapsulation by, for example, mixing a silica (B) that has been surface-treated with a coupling agent (E), with a thermosetting resin (A) and the like. On the other hand, a coupling agent (E) may also be incorporated into the resin composition for encapsulation by introducing, without subjecting silica (B) to the above-mentioned surface treatment, a coupling agent (E) together with various components such as the thermosetting resin (A) and the silica (B), and mixing these components.

Regarding the coupling agent (E), known coupling agents such as, for example, various silane-based compounds such as an epoxysilane, a mercaptosilane, an aminosilane, an alkylsilane, a ureidosilane, a vinylsilane, and a methacrylsilane; titanium-based compounds; aluminum chelates; and aluminum/zirconium-based compounds can be used. Examples of these agents include silane-based coupling agents such as vinyltrichlorosilane, vinyltrimethoxysilane, vinyltriethoxysilane, vinyltris(β-methoxyethoxy) silane, γ-methacryloxypropyltrimethoxysilane, β-(3,4-epoxycyclohexyl)ethyltrimethoxysilane, γ-glycidoxypropyltrimethoxysilane, γ-glycidoxypropyltriethoxysilane, γ-glycidoxypropylmethyldimethoxysilane, γ-methacryloxypropylmethyldiethoxysilane, γ-methacryloxypropyltriethoxysilane, vinyltriacetoxysilane, γ-mercaptopropyltrimethoxysilane, γ-aminopropyltriethoxysilane, γ-anilinopropyltrimethoxysilane, γ-anilinopropylmethyldimethoxysilane, γ-[bis(β-hydroxyethyl)]aminopropyltriethoxysilane, N-β-(aminoethyl)-γ-aminopropyltrimethoxysilane, N-β-(aminoethyl)-γ-aminopropyltriethoxysilane, N-β-(aminoethyl)-γ-(aminopropylmethyldimethoxysilane, N-phenyl-γ-aminopropyltrimethoxysilane, γ-(β-aminoethyl) aminopropyldimethoxymethylsilane, N-(trimethoxysilylpropyl)ethylenediamine, N-(dimethoxymethylsilylisopropyl)ethylenediamine, methyltrimethoxysilane, dimethyldimethoxysilane, methyltriethoxysilane, N-β-(N-vinylbenzylaminoethyl)-γ-(aminopropyltrimethoxysilane, γ-chloropropyltrimethoxysilane, hexamethyldisilane, vinyltrimethoxysilane, γ-mercaptopropylmethyldimethoxysilane, 3-isocyanatopropyltriethoxysilane, 3-acryloxypropyltrimethoxysilane, and a hydrolysate of 3-triethoxysilyl-N-(1, 3-dimethylbutylidene)propylamine; and titanate-based coupling agents such as isopropyltriisostearoyl titanate, isopropyl tris(dioctyl pyrophosphate) titanate, isopropyl tri (N-aminoethyl-aminoethyl) titanate, tetraoctyl bis(ditridecyl phosphite) titanate, tetra(2,2-diallyloxymethyl-1-butyl)bis (ditridecyl)phosphite titanate, bis(dioctyl pyrophosphate) oxyacetate titanate, bis(dioctyl pyrophosphate) ethylene titanate, isopropyl trioctanoyl titanate, isopropyl dimethacrylisostearoyl titanate, isopropyl tridodecyl benzenesulfonyl titanate, isopropyl isostearoyldiacryl titanate, isopropyl tri(dioctyl phosphate) titanate, isopropyl tricumylphenyl titanate, and tetraisopropyl bis(dioctyl phosphite) titanate. These may be used singly, or two or more kinds thereof may be used in combination. Among these, a silane-based compound such as an epoxysilane, a mercaptosilane, an aminosilane, an alkylsilane, a ureidosilne, or a vinylsilane is more preferred.

The content of the coupling agent (E) in the resin composition for encapsulation is, for example, preferably equal to or more than 0.01% by mass, and more preferably equal to or more than 0.03% by mass, with respect to the total amount of the resin composition for encapsulation. Thereby, dispersibility of the silica (B) in the resin composition for encapsulation can be enhanced. For this reason, the moisture-resistant reliability, reflow resistance, and the like can be enhanced more effectively. Furthermore, the content of the coupling agent (E) in the resin composition for encapsulation is, for example, preferably equal to or less than 5% by mass, and more preferably equal to or less than 3% by mass, with respect to the total amount of the resin composition for encapsulation. Thereby, satisfactory fluidity of the resin composition for encapsulation can be obtained, and enhancement of moldability can be promoted.

In the resin composition for encapsulation, if necessary, various additives such as filler materials other than silica; ion scavengers exemplified by inorganic ion exchangers such as hydrotalcites and polyvalent metal acid salts; low stress materials such as silicone rubber; mold release agents, including natural waxes such as carnauba wax, synthetic waxes, higher fatty acids and metal salts thereof, such as zinc stearate, and paraffins; colorants such as carbon black and red iron oxide; flame retardants such as aluminum hydroxide, magnesium hydroxide, zinc borate, zinc molybdate, and phosphazene; and oxidation inhibitors may be incorporated as appropriate. Regarding the filler material other than silica, one kind or two or more kinds selected from inorganic filler materials such as talc, alumina, titanium white, and silicon nitride; and organic filler materials such as an organosilicon powder and a polyethylene powder can be incorporated.

The method for producing the resin composition for encapsulation of the present embodiment is not particularly limited; however, for example, a granular resin composition obtained by mixing the above-mentioned various components using a known means, melt-kneading the mixture with a kneading machine such as a roll, a kneader, or an extruder, cooling the kneaded product, and then pulverizing the resultant; a product obtained by tableting the pulverized product into a tablet form; or a granular product produced by screening the pulverized product, or subjecting the pulverized product to a granulation method of appropriately adjusting the dispersity, fluidity and the like by a centrifugal milling method, a hot cutting method or the like, can be used as the resin composition for encapsulation.

Furthermore, a sheet-like resin composition for encapsulation can be obtained by making a varnish-like resin composition for encapsulation into a film. For example, a sheet-like resin composition for encapsulation can be obtained by, for example, removing the solvent from a coating film obtained by applying a resin composition for encapsulation. In regard to such a sheet-like resin composition for encapsulation, the percentage content of the solvent can be adjusted to be equal to or less than 5% by mass with respect to the total amount of the resin composition.

In the following description, the physical properties of the resin composition for encapsulation of the present embodiment will be explained.

The upper limit of the flexural modulus at room temperature of a cured product obtainable by heating the resin composition for encapsulation of the present embodiment, for example, under the conditions of 200° C. and 120 seconds, and then heating the resin composition under the conditions of 250° C. for 240 minutes, may be, for example, equal to or lower than 50 GPa, may be equal to or lower than 40 GPa, or may be equal to or lower than 25 GPa. Thereby, external stress can be effectively relieved, and an increase in the reliability of semiconductor devices can be promoted. On the other hand, the lower limit of the flexural modulus at room temperature of the cured product is, for example, equal to or higher than 10 GPa, preferably equal to or higher than 11 GPa, and more preferably equal to or higher than 12 GPa. Thereby, the mechanical strength can be increased even in a high-temperature environment.

The upper limit of the flexural modulus at 250° C. of a cured product obtainable by heating the resin composition for encapsulation of the present embodiment, for example, under the conditions of 200° C. and 120 seconds, and then heating the resin composition under the conditions of 250° C. for 240 minutes, may be, for example, equal to or lower than 16 GPa, may be equal to or lower than 15 GPa, or may be equal to or lower than 14 GPa. Thereby, external stress can be effectively relieved, and an increase in the reliability of semiconductor devices can be promoted. On the other hand, the lower limit of the flexural modulus at 250° C. of the cured product is, for example, equal to or higher than 3 GPa, preferably equal to or higher than 5 GPa, and more preferably equal to or higher than 7 GPa. Thereby, the mechanical strength can be increased even in a high-temperature environment.

The flexural modulus can be measured according to JIS K 6911, for example, using a specimen produced by the following method. First, the resin composition for encapsulation is injection molded using a transfer molding apparatus at a mold temperature of 200° C., an injection pressure of 9.8 MPa, and a curing time of 120 seconds, and thus a molded article having a size of 10 mm in width×4 mm in thickness× 80 mm in length is obtained. The molded article thus obtained is heated and cured under the conditions of 250° C. and 240 minutes, and thereby a specimen for measurement is produced.

The glass transition temperature of a cured product obtainable by heating the resin composition for encapsulation of the present embodiment, for example, under the conditions of 200° C. and 120 seconds, and then heating the resin composition under the conditions of 250° C. for 240 minutes, is preferably equal to or higher than 250° C., and more preferably equal to or higher than 255° C. Thereby, the heat resistance of semiconductor devices can be effectively increased. The upper limit of the glass transition temperature of the cured product is not particularly limited; however, the upper limit can be set to, for example, a temperature equal to or lower than 350° C.

The glass transition temperature can be measured using a thermomechanical analyzer, for example, using a specimen produced by the following method. First, the resin composition for encapsulation is injection molded using a transfer molding apparatus at a mold temperature of 200° C., an injection pressure of 9.8 MPa, and a curing time of 120 seconds, and thus a molded article having a size of 15 mm×4 mm×4 mm is obtained. The molded article thus obtained is heated and cured under the conditions of 250° C. and 240 minutes, and thereby a specimen for measurement is produced.

The flexural modulus and the glass transition temperature of a cured product of the resin composition for encapsulation according to the present embodiment can be controlled by, for example, respectively preparing the types or mixing ratios of the various components included in the resin composition for encapsulation.

Next, a semiconductor device will be explained.

FIG. 1 is a cross-sectional view illustrating an example of a semiconductor device 100 according to the present embodiment. The semiconductor device 100 according to the present embodiment includes a semiconductor element 20 mounted on a substrate 30, and an encapsulant material 50 encapsulating the semiconductor element 20. The semiconductor element 20 is a power semiconductor element formed from SiC, GaN, Ga$_2$O$_3$, or diamond. Furthermore, the encapsulant material 50 is constructed from a cured product obtainable by curing the resin composition for encapsulation according to the present embodiment.

In regard to the semiconductor device 100 according to the present embodiment, the semiconductor element 20 is a power semiconductor element formed from SiC, GaN, Ga$_2$O$_3$, or diamond as described above, and can be operated at a high temperature such as 200° C. or higher. The encapsulant material 50 formed using the resin composition for encapsulation according to the present embodiment exhibits excellent heat resistance as described above, even during use for a long time period in such a high-temperature environment. Therefore, the reliability of the semiconductor device 100 can be increased. The semiconductor element 20 can be produced into, for example, a power semiconductor element having an input power of 1.7 W or higher.

In FIG. 1, an example in which the substrate 30 is a circuit board is illustrated. In this case, as illustrated in FIG. 1, on the other surface of the substrate 30 on the opposite side of the surface where the semiconductor element 20 is mounted, for example, a plurality of solder balls 60 is formed. The semiconductor element 20 is mounted on the substrate 30 and is electrically connected to the substrate 30 through a wire 40. Meanwhile, the semiconductor element 20 may be flip-chip mounted on the substrate 30. Here, the wire 40 is formed from, for example, copper.

The encapsulant material 50 encapsulates the semiconductor element 20, for example, so as to cover a surface of the semiconductor element 20, the surface being on the opposite side of the other surface that faces the substrate 30. That is, the resin composition for encapsulation of the present embodiment can be used for encapsulation so as to cover a surface between the surfaces of a power semiconductor element (semiconductor element 20) mounted on the substrate 30, the surface being on the opposite side of the other surface that faces the substrate 30. In the example illustrated in FIG. 1, the encapsulant material 50 is formed so as to cover the above-mentioned surface and lateral surfaces of the semiconductor element 20. The encapsulant material 50 can be formed by, for example, encapsulation molding a resin composition for encapsulation using a known method such as a transfer molding method or a compression molding method.

Figure 2:
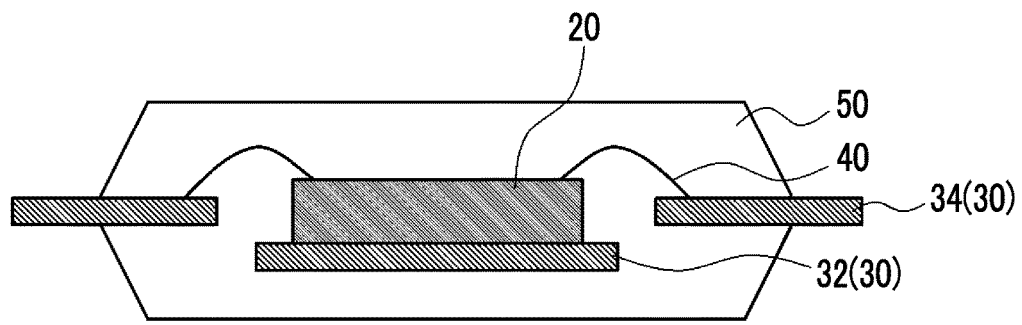
FIG. 2 is a cross-sectional view illustrating an example of a semiconductor device according to the present embodiment.

FIG. 2 is a cross-sectional view illustrating an example of the semiconductor device 100 according to the present embodiment, and illustrates an example that is different from that of FIG. 1. The semiconductor device 100 illustrated in FIG. 2 uses a lead frame as the substrate 30. In this case, the semiconductor element 20 is mounted on, for example, a die pad 32 in the substrate 30 and is electrically connected to an outer lead 34 through a wire 40. The semiconductor element 20 is a power semiconductor element formed from SiC, GaN, Ga$_2$O$_3$, or diamond, similarly to the example illustrated in FIG. 1. Furthermore, the encapsulant material 50 is formed using the resin composition for encapsulation according to the present embodiment, similarly to the example illustrated in FIG. 1.

The present invention is not intended to be limited to the embodiment described above, and any modifications, improvements and the like made to the extent that the purpose of the invention can be achieved are construed to be included in the present invention.

Examples

Next, Examples of the present invention will be described.

(Preparation of Resin Composition for Encapsulation)

In each of various Examples and various Comparative Examples, a resin composition for encapsulation was prepared as described below. First, various components were mixed using a mixer according to the composition indicated in Table 2. Next, the mixture thus obtained was roll-kneaded, subsequently cooled, pulverized, and tableted. Thus, a resin composition for encapsulation in a tablet form was obtained.

The details of the various components in Table 2 are as follows. Furthermore, the mixing ratios of the various components indicated in Table 2 represent mixing ratios (mass %) with respect to the total amount of the resin composition for encapsulation.

(A) Thermosetting Resin

Thermosetting resin 1: Compound represented by the following Formula (5) having two or more maleimide groups Thermosetting resin 2: Compound represented by the following Formula (6) having two or more benzoxazine rings (manufactured by Shikoku Chemicals Corporation, P-d type benzoxazine)

Thermosetting resin 3: Biphenyl novolac type epoxy resin (manufactured by Nippon Kayaku Co., Ltd., NC-3000L)

Thermosetting resin 4: Trisphenylmethane type phenolic resin (manufactured by Meiwa Chemical Co., Ltd., MEH-7500)

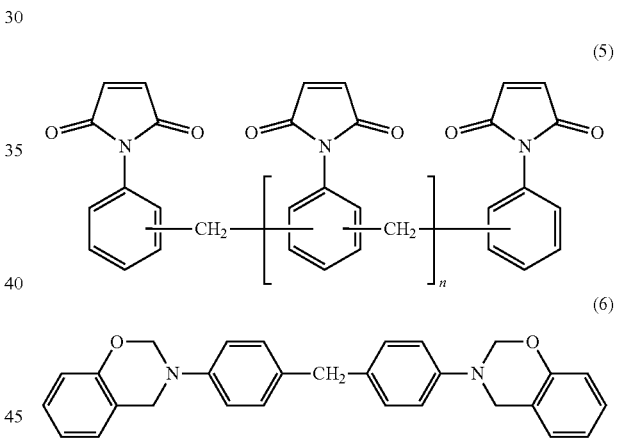

(B) Silica

Regarding silica (B1) to (B4) used to prepare the resin compositions for encapsulation of various Examples and various Comparative Examples as indicated in Table 2, the materials described in the following Table 1 were used.

Furthermore, the average particle size d50 of silica (B1) was 0.5 µm, the average particle size d50 of silica (B2) was 1 µm, the average particle size d50 of silica (B3) was 32 µm, and the average particle size d50 of silica (B4) was 12 µm.

For each of silica (B1) to silica (B4), the contents of Fe, Mn, Al, Mg, Ca, Ni, Ti, P, and SiO$_2$ in such silica were as indicated in the following Table 1. The contents of Fe, Mn, Al, Mg, Ca, Ni, Ti, and P were respectively measured by ICP emission spectroscopy. Furthermore, the contents of Fe, Mn, Al, Mg, Ca, Ni, Ti, and P indicated in the following Table 1 refer to the proportions of the elements in the total amount of individual silicas, and the unit is ppm in all cases. In the following Table 1, the abbreviation "n.d." means not detected.

TABLE 1

|  | Silica (B1) | Silica (B2) | Silica (B3) | Silica (B4) |
|---|---|---|---|---|
| Fe | 1600 | 100 | 8.42 | 16 |
| Mn | 32 | 3 | 0.212 | 0.352 |
| Al | 710 | 100 | 3120 | 705 |
| Mg | 23 | <1 | 4.6 | 7.67 |
| Ca | 300 | 1 | 10.6 | 12.8 |
| Ni | 48 | 7 | 0.467 | 0.78 |
| Ti | 120 | 10 | 8.84 | 9.75 |
| P | 65 | <10 | n.d. | n.d. |
| $SiO_2$ | 99.8 mass % or more | 99.8 mass % or more | 99.8 mass % or ore | 99.8 mass % or more |

(D) Curing Accelerator

Curing accelerator: 2-Methylimidazole (manufactured by Shikoku Chemicals Corporation, 2MZ-H)

(E) Coupling Agent

Coupling agent: Phenylaminopropyltrimethoxysilane (manufactured by Dow Corning Toray Co., Ltd., CF-4083)

(F) Other Components

Mold release agent: Montanic acid ester (manufactured by Clariant Japan K.K., LICOLUB WE-4)

Colorant: Carbon black (manufactured by Mitsubishi Chemical Corporation, #5)

(Glass Transition Temperature)

For each of the various Examples and various Comparative Examples, the glass transition temperature of a cured product of the resin composition for encapsulation thus obtained was measured as follows. First, the resin composition for encapsulation was injection molded using a transfer molding apparatus, by setting the mold temperature to a predetermined temperature, at an injection pressure of 9.8 MPa and for a curing time of 120 seconds, and a molded article having a size of 15 mm×4 mm×4 mm was obtained. Specifically, the mold temperature was set to 200° C.

Next, the molded article thus obtained was post-cured at 250° C. for 240 minutes, and thereby a specimen was produced. Subsequently, for the specimen thus obtained, the glass transition temperature was measured using a thermomechanical analyzer (manufactured by Seiko Instruments, Inc., TMA100) under the conditions of a measurement temperature range of 0° C. to 320° C. and a rate of temperature increase of 5° C./min. The unit of the glass transition temperature in Table 2 is ° C.

(Flexural Modulus)

For each of the various Examples and various Comparative Examples, the flexural modulus of a cured product of the resin composition for encapsulation was measured as follows. First, the resin composition for encapsulation was injection molded using a transfer molding apparatus at a mold temperature of 200° C. and an injection pressure of 9.8 MPa for a curing time of 120 seconds, and thus a molded article having a size of 10 mm in width×4 mm in thickness× 80 mm in length was obtained. Next, the molded article thus obtained was post-cured at 250° C. for 240 minutes, and thereby a specimen was produced. Next, the flexural moduli of the specimen at room temperature of 25° C. and at 250° C. were measured according to JIS K 6911. The unit for the flexural modulus given in Table 2 is GPa.

(High-Temperature Long-Term Storage Characteristics)

For each of the various Examples and various Comparative Examples, the high-temperature storage characteristics of a cured product of the resin composition for encapsulation thus obtained were measured as follows. First, the resin composition for encapsulation was injection molded using a transfer molding apparatus at a mold temperature of 200° C. and an injection pressure of 9.8 MPa for a curing time of 120 seconds, and thus a molded article having a diameter of 10 mmφ×a thickness of 4 mm was obtained. Next, the molded article thus obtained was post-cured at 250° C. for 240 minutes, and then was dried for 16 hours at 150° C. Thus, a specimen was obtained, and the initial mass of this specimen was measured. Next, the specimen was introduced into an oven at 250° C. and was taken out after 100 hours, 250 hours, 500 hours, or 1,000 hours, and the mass was measured. The mass reduction ratio given in Table 2 was a value obtained by calculating the amount of mass reduction after 1,000 hours with respect to the initial mass, and the unit is percentage by mass (mass %).

TABLE 2

| | | Unit: | Example 1 | Example 2 | Example 3 | Example 4 | Example 5 | Example 6 |
|---|---|---|---|---|---|---|---|---|
| Resin composition for encapsulation | Thermosetting resin 1 | Mass % | 14 | 12 | 14 | 14 | 14 | 14 |
| | Thermosetting resin 2 | | 7 | — | 7 | 7 | 7 | 7 |
| | Thermosetting resin 3 | | — | 6 | — | — | — | — |
| | Thermosetting resin 4 | | — | 3 | — | — | — | — |
| | Silica (B1) | | — | — | 1 | 3 | 5 | 7 |
| | Silica (B2) | | 15 | 15 | 14 | 12 | 10 | 8 |
| | Silica (B3) | | 53 | 53 | 53 | 53 | 53 | 53 |
| | Silica (B4) | | 10 | 10 | 10 | 10 | 10 | 10 |
| | Curing accelerator | | 0.2 | 0.2 | 0.2 | 0.2 | 0.2 | 0.2 |
| | Coupling agent | | 0.4 | 0.4 | 0.4 | 0.4 | 0.4 | 0.4 |
| | Mold release agent | | 0.2 | 0.2 | 0.2 | 0.2 | 0.2 | 0.2 |
| | Colorant | | 0.2 | 0.2 | 0.2 | 0.2 | 0.2 | 0.2 |
| | Total | | 100 | 100 | 100 | 100 | 100 | 100 |
| Content of impurities with respect to total amount of silica | Fe | ppm | 27 | 27 | 46 | 85 | 123 | 162 |
| | Mn | | 1 | 1 | 1 | 2 | 3 | 3 |
| | Ni | | 2 | 2 | 2 | 3 | 4 | 5 |
| | Ti | | 9 | 9 | 11 | 13 | 16 | 19 |
| | Ca | | 9 | 9 | 14 | 21 | 28 | 36 |
| | P | | 2 | 2 | 3 | 4 | 5 | 7 |
| | Fe + Mn | | 28 | 28 | 47 | 87 | 126 | 165 |
| | Fe + Mn + Ni + Ti | | 39 | 39 | 60 | 103 | 146 | 189 |
| | Fe/(Fe + Mn + Ni + Ti) | % | 69.2 | 69.2 | 76.7 | 82.5 | 84.2 | 85.7 |
| | Glass transition temperature | ° C. | 285 | 268 | 286 | 286 | 285 | 285 |
| | Flexural modulus at room temperature 25° C. | GPa | 18 | 13 | 18 | 18 | 18 | 18 |
| | Flexural modulus at 250° C. | GPa | 12 | 8 | 12 | 13 | 13 | 13 |

TABLE 2-continued

| | | Unit: | | | | | |
|---|---|---|---|---|---|---|---|
| High-temperature long-term storage characteristics (mass reduction ratio after 1000 hours) | | Mass % | −2.2 | −3.1 | −2.3 | −2.4 | −2.3 | −2.7 |

| | | Unit: | Example 7 | Comparative Example 1 | Comparative Example 2 | Comparative Example 3 | Comparative Example 4 |
|---|---|---|---|---|---|---|---|
| Resin composition for encapsulation | Thermosetting resin 1 | Mass % | 14 | 14 | 14 | 14 | 12 |
| | Thermosetting resin 2 | | 7 | 7 | 7 | 7 | — |
| | Thermosetting resin 3 | | — | — | — | — | 6 |
| | Thermosetting resin 4 | | — | — | — | — | 3 |
| | Silica (B1) | | 9 | 11 | 13 | 15 | 15 |
| | Silica (B2) | | 6 | 4 | 2 | — | — |
| | Silica (B3) | | 53 | 53 | 53 | 53 | 53 |
| | Silica (B4) | | 10 | 10 | 10 | 10 | 10 |
| | Curing accelerator | | 0.2 | 0.2 | 0.2 | 0.2 | 0.2 |
| | Coupling agent | | 0.4 | 0.4 | 0.4 | 0.4 | 0.4 |
| | Mold release agent | | 0.2 | 0.2 | 0.2 | 0.2 | 0.2 |
| | Colorant | | 0.2 | 0.2 | 0.2 | 0.2 | 0.2 |
| | Total | | 100 | 100 | 100 | 100 | 100 |
| Content of impurities with respect to total amount of silica | Fe | ppm | 200 | 239 | 278 | 316 | 316 |
| | Mn | | 4 | 5 | 6 | 6 | 6 |
| | Ni | | 7 | 8 | 9 | 10 | 10 |
| | Ti | | 22 | 25 | 28 | 30 | 30 |
| | Ca | | 44 | 51 | 59 | 67 | 67 |
| | P | | 8 | 10 | 11 | 13 | 13 |
| | Fe + Mn | | 204 | 244 | 284 | 322 | 322 |
| | Fe + Mn + Ni + Ti | | 233 | 277 | 321 | 362 | 362 |
| Fe/(Fe + Mn + Ni + Ti) | | % | 85.8 | 86.3 | 86.6 | 87.3 | 87.3 |
| Glass transition temperature | | °C. | 285 | 285 | 284 | 286 | 268 |
| Flexural modulus at room temperature 25° C. | | GPa | 18 | 18 | 18 | 18 | 13 |
| Flexural modulus at 250° C. | | GPa | 13 | 12 | 12 | 12 | 8 |
| High-temperature long-term storage characteristics (mass reduction ratio after 1000 hours) | | Mass % | −3.8 | −4.9 | −5.3 | −5.6 | −4.8 |

Figure 3:
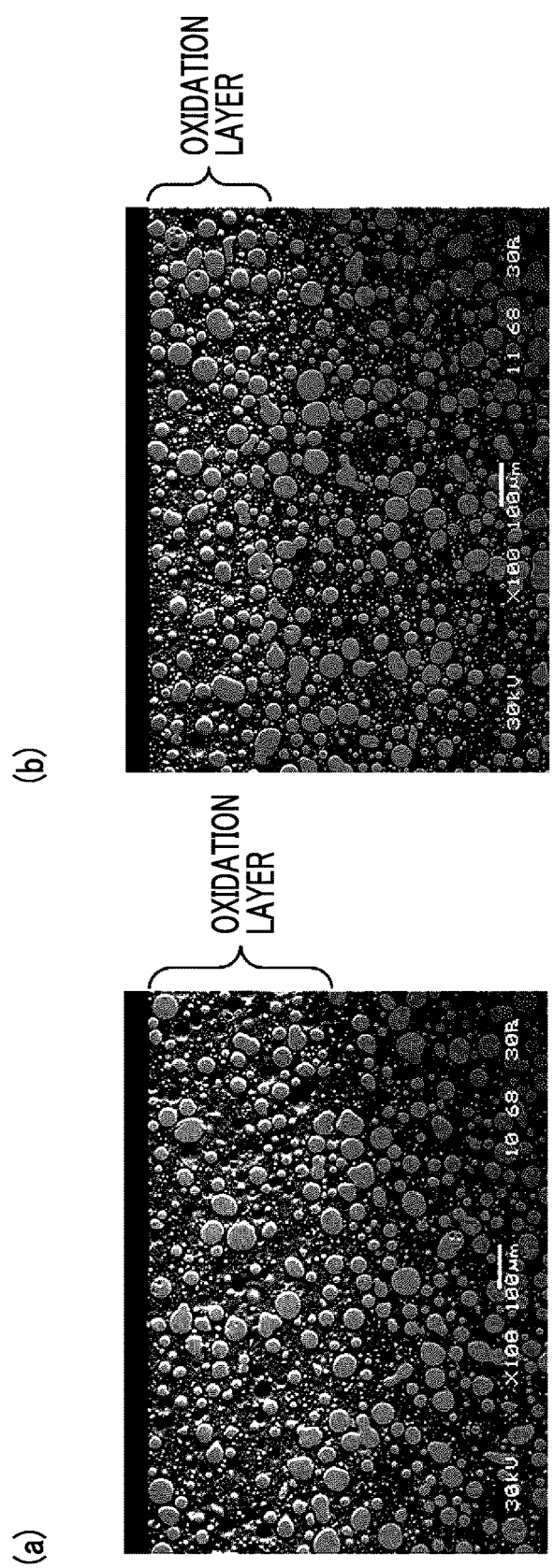
FIG. 3 is a SEM photograph showing a cross-sectional structure of an encapsulant material after a test on high-temperature long-term storage characteristics.

FIG. 3 shows SEM (Scanning Electron Microscope) photographs showing the cross-sectional structure of an encapsulant material after a test for high-temperature long-term storage characteristics. FIG. 3(a) shows the cross-sectional structure of the surface of the encapsulant material according to Comparative Example 1, and FIG. 3(b) shows the cross-sectional structure of the surface of the encapsulant material according to Example 1. When a comparison between FIG. 3(a) and FIG. 3(b) is made, it is understood that the thickness of the oxidation layer (layer in which peeling or cracking that occurs at the interface between a resin and silica, or oxidative decomposition of the resin itself occurs) produced in the encapsulant material as a result of the test for high-temperature long-term storage characteristics is smaller in Example 1 than the thickness of Comparative Example 1. That is, in Example 1, oxidation of the interior of the encapsulant material is suppressed more effectively than in Comparative Example 1. As such, it can be seen from FIG. 3 that deterioration in the case of long-term storage under high temperature conditions at 200° C. or higher can be suppressed by the resin compositions for encapsulation according to the Examples.

This patent application claims priority from Japanese Patent Application No. 2015-254082 filed on Dec. 25, 2015, the disclosure of which is incorporated herein by reference.

The invention claimed is:

1. A resin composition for encapsulation used for encapsulating a power semiconductor element formed from SiC, GaN, $Ga_2O_3$, or diamond, the resin composition for encapsulation comprising:
a thermosetting resin (A); and
silica (B),
wherein the silica (B) includes Fe and Mn,
the content of Fe is equal to or less than 220 ppm with respect to the total amount of the silica (B),
the resin composition is in a granular form, a tablet form, or a sheet form, and
the sum value of the contents of Fe and Mn is equal to or less than 220 ppm with respect to the total amount of silica (B).

2. The resin composition for encapsulation according to claim 1,
wherein the silica (B) further includes Ni and Ti, and
the sum value of the contents of Fe, Mn, Ni, and Ti is equal to or less than 250 ppm with respect to the total amount of silica (B).

3. The resin composition for encapsulation according to claim 2,
wherein the proportion of the content of Fe with respect to the sum value of the contents of Fe, Mn, Ni, and Ti is equal to or less than 86.0%.

4. The resin composition for encapsulation according to claim 1,
wherein the thermosetting resin (A) includes a compound having two or more maleimide groups.

5. The resin composition for encapsulation according to claim 1,
wherein the content of $SiO_2$ with respect to the total amount of the silica (B) is equal to or more than 99.8% by mass.

6. The resin composition for encapsulation according to claim 1,
wherein the content of the silica (B) is equal to or more than 55% by mass and equal to or less than 90% by mass with respect to the total amount of the resin composition for encapsulation.

7. The resin composition for encapsulation according to claim 1, wherein the flexural modulus at 250° C. of a cured product obtainable by heating the resin composition for encapsulation under the conditions of 200° C. and 120 seconds and then heating the resin composition under the conditions of 250° C. and 240 minutes, is equal to or higher than 3 GPa and equal to or lower than 16 GPa.

8. The resin composition for encapsulation according to claim 1,
wherein the glass transition temperature of a cured product obtainable by heating the resin composition for encapsulation under the conditions of 200° C. and 120 seconds and then heating the resin composition under the conditions of 250° C. and 240 minutes, is equal to or higher than 250° C. and equal to or lower than 350° C.

9. The resin composition for encapsulation according to claim 1,
wherein the resin composition for encapsulation is used for encapsulation so as to cover a surface between the surfaces of the power semiconductor elements mounted over a substrate, the surface being on the opposite side of the other surface that faces the substrate.

10. The resin composition for encapsulation according to claim 1,
wherein the resin composition for encapsulation is used for forming an encapsulant material so as to encapsulate the power semiconductor element having an operating environment of 200° C. or higher.

11. A semiconductor device comprising:
a power semiconductor element mounted over a substrate and formed from SiC, GaN, $Ga_2O_3$, or diamond; and
an encapsulant material constructed from a cured product of the resin composition for encapsulation according to claim 1 and intended for encapsulating the power semiconductor element.

12. The semiconductor device according to claim 11,
wherein the encapsulant material is used for encapsulating the power semiconductor element so as to cover a surface of the power semiconductor element, the surface being the surface on the opposite of the other surface that faces the substrate.

* * * * *